United States Patent
Wan et al.

(10) Patent No.: US 8,373,183 B2
(45) Date of Patent: Feb. 12, 2013

(54) LED PACKAGE FOR UNIFORM COLOR EMISSION

(75) Inventors: Shan Mei Wan, Hong Kong (HK); Chang Shu Lee, Tai Chung (TW); Ming Lu, Taipei (TW)

(73) Assignee: Hong Kong Applied Science and Technology Research Institute Company Limited, New Territories (HK)

( * ) Notice: Subject to any disclaimer, the term of this patent is extended or adjusted under 35 U.S.C. 154(b) by 33 days.

(21) Appl. No.: 13/031,629

(22) Filed: Feb. 22, 2011

(65) Prior Publication Data
US 2012/0211778 A1    Aug. 23, 2012

(51) Int. Cl.
*H01L 33/48*    (2010.01)
*H01L 33/50*    (2010.01)
*H01L 33/00*    (2010.01)
*F21S 2/00*    (2006.01)

(52) U.S. Cl. ............ 257/89; 257/E33.056; 257/E33.061; 438/26

(58) Field of Classification Search .................... None
See application file for complete search history.

(56) References Cited

U.S. PATENT DOCUMENTS

| | | | |
|---|---|---|---|
| 7,145,182 B2 * | 12/2006 | Peh | ................... 257/98 |
| 7,474,050 B2 * | 1/2009 | Kaneda et al. | ................ 313/504 |
| 7,675,132 B2 | 3/2010 | Waitl et al. | |
| 8,217,404 B2 * | 7/2012 | Wu et al. | ......................... 257/88 |
| 2006/0138937 A1 | 6/2006 | Ibbetson | |
| 2006/0186425 A1 | 8/2006 | Yano et al. | |
| 2007/0001178 A1 | 1/2007 | Tran et al. | |
| 2007/0096136 A1 * | 5/2007 | Sun | ................................. 257/99 |
| 2007/0158669 A1 | 7/2007 | Lee et al. | |
| 2007/0170454 A1 * | 7/2007 | Andrews | ....................... 257/100 |

(Continued)

FOREIGN PATENT DOCUMENTS

| | | |
|---|---|---|
| EP | 1914809 A1 | 4/2008 |
| JP | 61001066 A | 1/1986 |

(Continued)

OTHER PUBLICATIONS

Silicon Gel Offers Refractive index of 1.4 [online] NuSil Technology Jun. 4, 2009 (NuSil). Retrieved from the internet: < http://news.thomasnet.com/fullstory/Silicone-Gel-offers-refractive-index-of-1-40-560996 >.*

(Continued)

*Primary Examiner* — Thomas L Dickey
*Assistant Examiner* — Joseph Schoenholtz
(74) *Attorney, Agent, or Firm* — Ella Cheong Hong Kong; Sam T. Yip (57) ABSTRACT

A light emitting diode package for one or more light emitting diodes mounted on a substrate. A frame is disposed on at least a portion of the substrate and substantially surrounds, but does not contact, the light emitting diode. The frame is substantially transparent to light emitted from the light emitting diode and includes one or more first wavelength converting materials. The wavelength converting materials, which may be one or more phosphors, convert at least a portion of light emitted at the emission wavelength to different wavelength. A cover covers the light emitting diode within the frame. The cover layer includes one or more second wavelength converting materials differing from the first one or more wavelength converting materials in wavelength converting material concentration or in converted light wavelength or in combinations of wavelength converting materials.

25 Claims, 5 Drawing Sheets

$$\tan(90° - \Theta_B/2) = (h - a) / [(x/2) + y]$$

$$h <= [(x/2) + y] \tan(90° - \Theta_B/2) + a$$

U.S. PATENT DOCUMENTS

| | | |
|---|---|---|
| 2007/0272933 A1 | 11/2007 | Kim et al. |
| 2007/0278512 A1* | 12/2007 | Loh et al. .......... 257/99 |
| 2008/0023711 A1* | 1/2008 | Tarsa et al. ....... 257/98 |
| 2008/0224161 A1 | 9/2008 | Takada |
| 2008/0296599 A1 | 12/2008 | Mazzochette |
| 2009/0095971 A1* | 4/2009 | Glovatsky et al. ....... 257/99 |
| 2009/0321758 A1 | 12/2009 | Liu et al. |
| 2010/0025699 A1* | 2/2010 | Liu et al. .......... 257/89 |
| 2010/0044735 A1* | 2/2010 | Oyamada .......... 257/98 |
| 2010/0227423 A1* | 9/2010 | Jeong et al. ....... 438/26 |
| 2011/0006318 A1* | 1/2011 | Chung .......... 257/91 |
| 2012/0112236 A1* | 5/2012 | Higuma et al. ....... 257/98 |
| 2012/0126265 A1* | 5/2012 | Hsu et al. .......... 257/98 |

FOREIGN PATENT DOCUMENTS

| | | |
|---|---|---|
| WO | WO2010/027672 A2 | 3/2010 |

OTHER PUBLICATIONS

International Search Report for International Application PCT/CN2011 / 074327.*

* cited by examiner

LED PACKAGE FOR UNIFORM COLOR EMISSION

TECHNICAL FIELD

The present invention relates generally LED packaging. In particular it relates to a frame and a cover for light emitting diodes that provides improved color uniformity and luminous intensity, and methods of making the same.

BACKGROUND

A light emitting diode ("LED") is a semiconductor light source. LEDs provide numerous advantages over other light sources such as incandescent lights. Amongst other advantages, LEDs typically have longer lifetimes, greater reliability, faster switching characteristics and lower energy consumption. Recent advances have produced LEDs with luminous intensities (lumen per Watt) that are comparable with or surpass incandescent lights.

LED produce light by the spontaneous recombination of electron and hole pairs when the LED is forward biased above the threshold voltage in an electronic circuit. The wavelength of the light produced depends upon the band gap between the materials used in the p-n junction that form the LED. The wavelength of the light produced by an LED is typically in the infra red, visible or UV ranges. Detailed information on LEDs is found in "*Light emitting diodes*" by E. Fred Schubert, Cambridge University Press, which is hereby incorporated in its entirety by reference. Detailed information on semiconductor optics is found in "*Semiconductor optics*" by Claus F Klingshirn, Springer press, which is hereby incorporated in its entirety by reference.

For ease of manufacturing, the most common form of LED is a micron-sized planar square LED die disposed on a substrate. The semiconductor comprising the die is usually silicon, and the substrate may be a metal such as aluminum, which also functions as a heat sink. The LED die is electrically connected to circuitry on the substrate by fine metal wires. The LED die itself may be surface mounted on the substrate, or within a cavity on the substrate.

Various challenges exist in producing a LED with a high luminous output that is suitable for use as a light source in human environments. The first is maximizing light extraction from the planar LED die itself. As semiconductor materials have a high refractive index, a large quantity of the light produced undergoes total internal reflection (TIR) at the semiconductor-air interface. It is known in the art to reduce the amount of light that undergoes TIR by reducing the difference between the refractive indices at the semiconductor surface. As the semiconductor refractive index is a material characteristic, this is achieved by encapsulating the LED with an encapsulating material having a higher refractive index. Historically an epoxy material was used, and more recently silicone due to its comparatively higher transparency, color stability and thermal performance. Silicone, however, is relatively harder to dispense.

Figure 1:
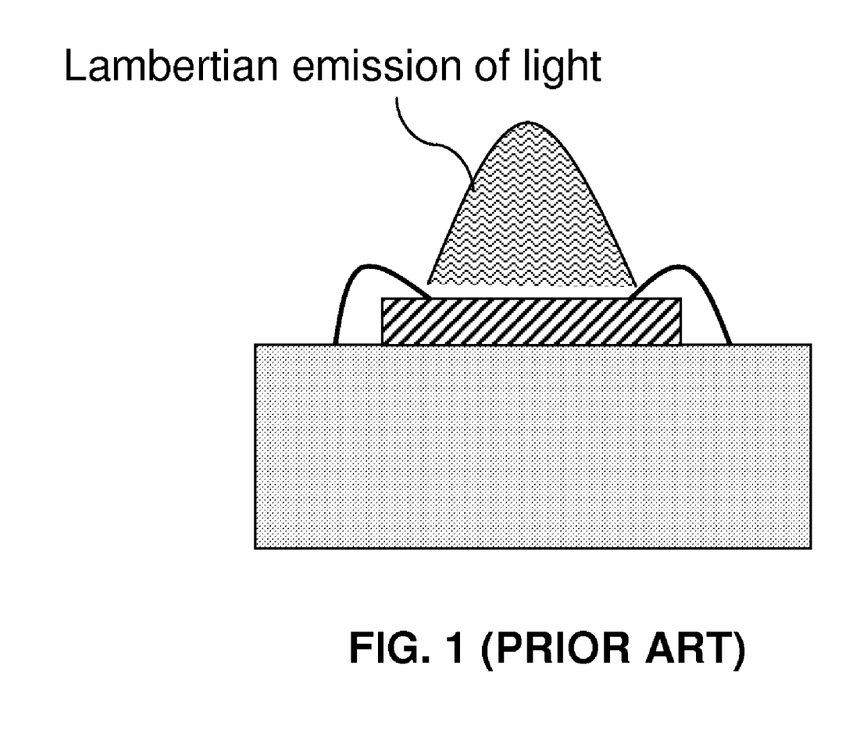
FIG. 1 shows a Lambertian emission pattern of a light emitting diode.

Planar LEDs have a Lambertian emission pattern, as shown in FIG. 1. In other words, the radiant intensity is directly proportional to the cosine of the angle between the observer's position and the surface normal. Consequently, the apparent radiance of the emitted light to an observer appears the same from all positions. The encapsulating material used to reduce TIR can also act as a lens and narrow the light beam emitted. Various shapes of encapsulating material have been used and it is known in the art to use a hemispherical shaped encapsulant material to maximize the light extraction efficiency from a planar LED die.

Some of the light that does escape is absorbed or reflected by the surrounding substrate material, especially when the LED die is located within a cavity.

A single unencapsulated LED produces monochromatic light. Due to the interest in using LEDs as ambient lighting sources, in recent years research has focused on producing LED packages that emit light of different colors to that emitted by the LED die. There has been considerable interest in producing white light. The most popular way of producing white light from a single LED is by disposing a wavelength converting material, such as a yellow phosphor, on the visible (emitting) side of a blue-light emitting LED die. A layer of wavelength converting material applied on the LED die will absorb some of the emitted photons, and down-convert them into visible wavelength light, resulting in a dichromatic light source of blue and yellow wavelength light. If the yellow and blue light is produced in the correct proportions it is perceived by the human eye as a white color.

It is known in the art to add a wavelength converting material to the encapsulating layer surrounding the LED die. Application of the encapsulating material may be by different methods. They can be divided into two types: those that use molding or pre-molding to fix directly to the substrate, and those that create and then fill a dam that encircles the LED die. The latter is usually referred to as dispensing as the encapsulating material is provided in liquid form followed by curing.

Factors affecting the color quality of the white color light are the quantity and distribution of the phosphor over the LED die. These determine the proportion of yellow wavelength light produced. When the phosphor is dispersed within the encapsulating material, process control issues can result in uneven phosphor distribution surrounding the LED. As a result, the light from the packaged LED may have a yellow "ring" away from the central beam axis. This also arises from the Lambertian emission profile of the LED and/or phosphor particle settling: there are too few phosphor particles on the center of the LED die to emit enough yellow light relative to the amount of blue light emitted, whilst towards the LED die sides there are too many phosphor particles relative to the amount of blue light emitted, and hence over stimulated to emit yellow light.

Thus there is a need in the art for packaged LEDs having uniform color emission properties.

SUMMARY OF THE INVENTION

The present invention provides a light emitting diode package for one or more light emitting diodes mounted on a substrate. A frame is disposed on at least a portion of the substrate and substantially surrounding, but not contacting, the light emitting diode. The frame is substantially transparent to light emitted from the light emitting diode and includes one or more first wavelength converting materials. The wavelength converting materials, which may be one or more fluorescence materials such as phosphors, convert at least a portion of light emitted from the light emitting diode at the emission wavelength to a wavelength different from the emission wavelength.

A cover covers the light emitting diode and is coupled to the frame, optionally at an outer frame edge and is also substantially transparent to light emitting from the light emitting diode. The cover includes second one or more wavelength converting materials differing from the one or more first wavelength converting materials in wavelength converting material concentration or in converted light wavelength or in combinations of wavelength converting materials.

DETAILED DESCRIPTION

Figure 4:
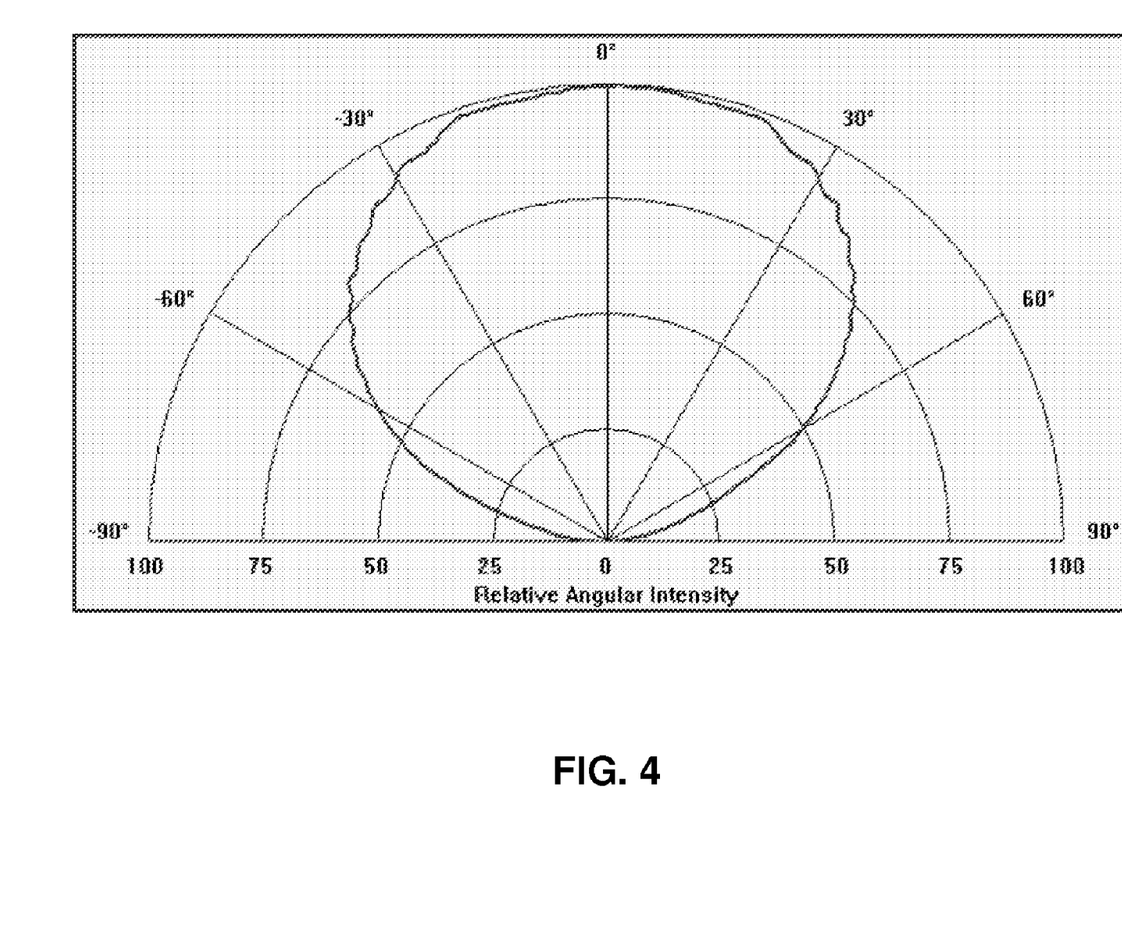
FIG. 4 depicts angular intensity of LED light emission for an LED die.

Turning to the drawings in detail, FIG. 4 depicts the angular intensity of LED light emission for an LED die. As can be seen in FIG. 4, the relative luminous intensity of emitted light drops by about 50% at an emission angle of plus or minus 60° and by about 90% at an emission angle of plus or minus 75°. Therefore it was discovered in the present invention that a uniform distribution of wavelength converting materials surrounding an LED die would generally result in insufficient wavelength converting material near the top of an LED covering layer (that is, the region having the greatest intensity of emitted light); similarly, a uniform distribution results in too large of a concentration of wavelength converting material positioned near the sides of an LED. As a result, the overall emitted light pattern would display undesirable non-uniform color characteristics. From this observation, the present invention was developed.

Figure 2A:
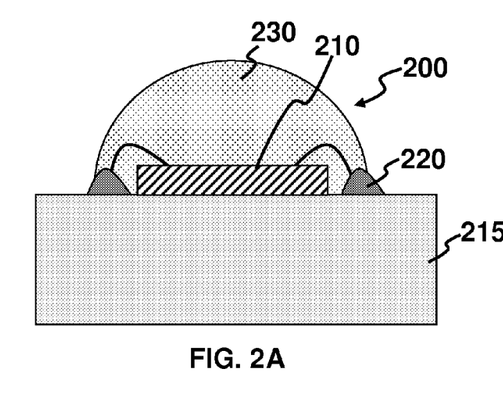
FIGS. 2A-2C schematically depicts LED packages according to embodiments of the present invention.

FIG. 2A schematically depicts a packaged light-emitting diode 200 according to one embodiment of the present invention. An LED 210 is positioned on a substrate 215. While the LED is shown on a level substrate surface, it is also understood that the LED can optionally be positioned in a cavity such as those used in conjunction with dispensing methods of fabrication.

In an exemplary embodiment, LED 210 is a primary color-emitting LED such as a blue LED for creating a "white" LED package whose emitted light appears "white" to the human eye, as discussed above. However other LEDs may be selected according to the overall light desired to be emitted by the LED package, such as UV or green LEDs. The LED can be selected from known LED materials such as semiconductor material LEDs and organic light emitting diodes (OLEDs).

Figure 3A:
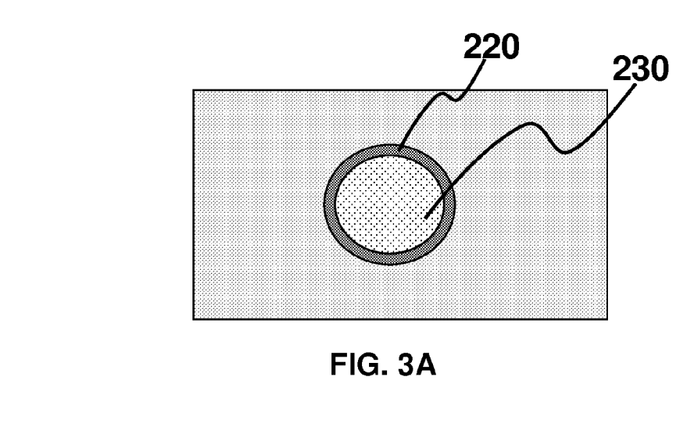
FIGS. 3A-3D depict top views of exemplary LED packages.
Figure 3B:
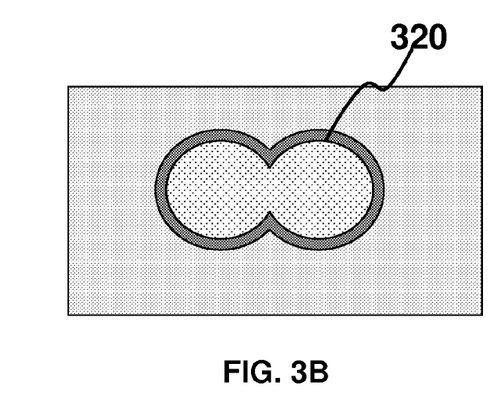
Figure 3C:
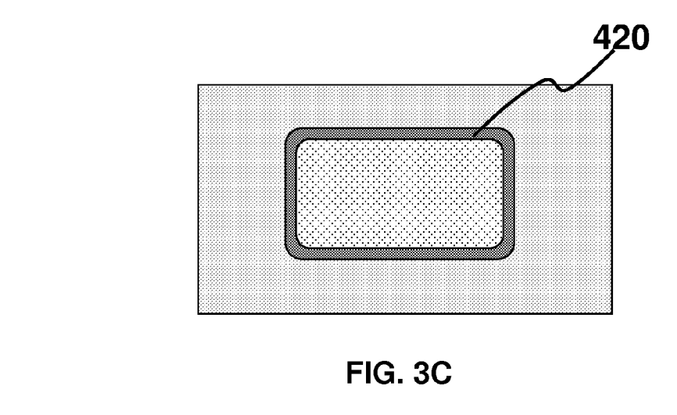
Figure 3D:
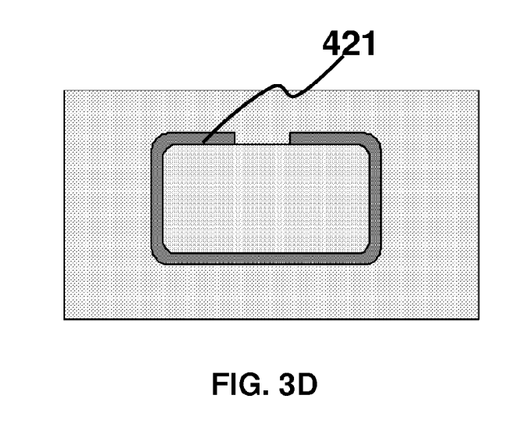

A frame 220 is created around LED 210 such that the LED is optionally positioned substantially with its center coinciding with the center of the shape created by frame 220. The shape of frame 220 is typically symmetrical about the center of the LED, although asymmetrical frames can also be used. Exemplary shapes are in the top views of FIGS. 3A-3D although the frames are not limited to these shapes. In FIG. 3A, the frame 220 is substantially circular. FIG. 3B depicts a frame shape 320 for two adjacent LEDs while FIG. 3C depicts a frame 420 suitable for an LED array. The frame may form a continuous perimeter around one or more LEDs ("closed frame") or the frame may be open—that is, the frame forms a non-continuous perimeter around one or more LEDs ("open frame"). FIG. 3D depicts a frame 421 which is an open frame, while the frame 420 shown in FIG. 3C is a closed frame.

In an exemplary embodiment, the frame is formed from a layer of silicone that is substantially transparent to the light emitted by LED 210. However, it is understood that other materials, either transparent or semitransparent, can be used for the boundary including, but not limited to, epoxies, acrylic resins, other polymeric materials, or glasses (such as spin-on glass). Embedded in the frame material is one or more wavelength converting materials. The wavelength converting material(s) converts at least a portion of the emitted LED light to another wavelength. In an exemplary embodiment, the wavelength converting material is one or more fluorescence materials which convert the wavelength through a process of stimulated emission by absorbing an emitted blue photon and emitting a photon of a different color. Exemplary fluorescence materials include phosphors such as yttrium aluminum garnet (YAG)-based materials (optionally doped with cerium), terbium aluminum garnet (TAG)-based materials, and silicate-based, sulfur-based, nitrogen-based, or nitrogen oxide based materials, but are not limited to these materials. A single wavelength converting material or a combination of wavelength converting materials can be selected depending upon the overall desired emission from the packaged LED.

Figure 5:
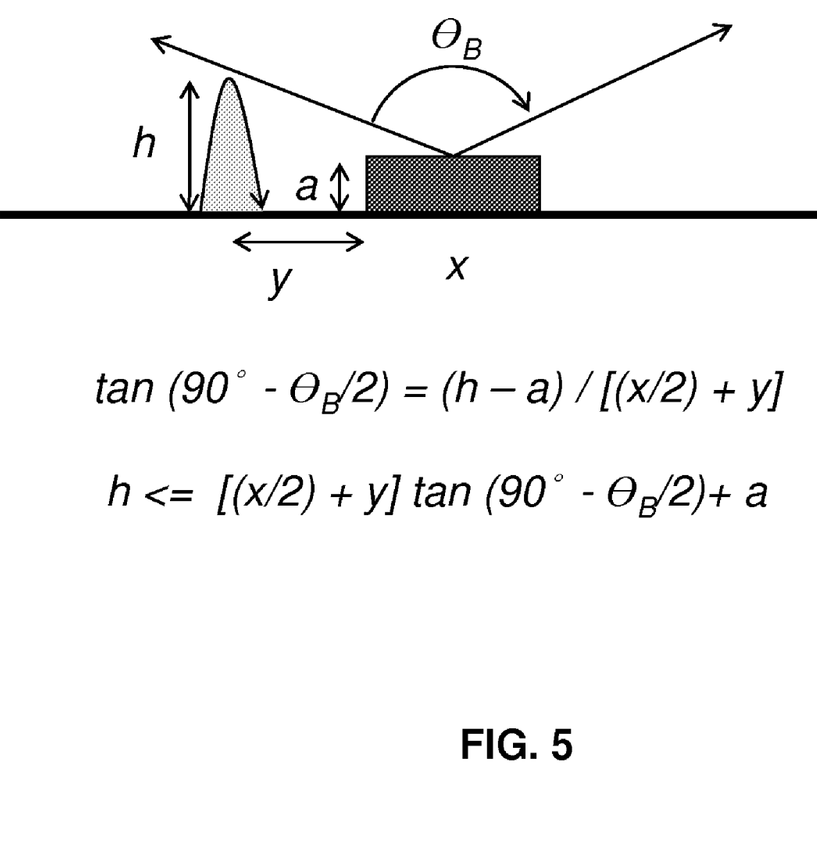
FIG. 5 shows the parameters of a formula for calculating boundary height for an LED package.

The height of the frame 220 is selected according to the angle of luminous intensity as depicted in FIG. 4 and discussed above. In an exemplary embodiment, the height of the frame 220 is determined according to the following formula (see FIG. 5 for parameter depiction):

$$h \leq [(x/2)+y] \tan(90° - \Theta_B/2) + a$$

where $\Theta_B$ is the beam angle of emitted light from the LED, a is a height of the LED;

y is a distance between the edge of the LED and a center line of frame 220;

and x is a width of the LED.

The thickness of frame 220 is generally larger than 30% of the width of the LED die 210 that it surrounds.

A cover 230 directly contacts the LED 210 and frame 220 as seen in FIG. 2A. In an exemplary embodiment, cover 230 has a substantially hemispherical shape. If silicone is used to form cover 230, the surface tension of the silicone typically forms a hemispherical shape. The degree of curvature can be controlled to a certain extent by the viscosity of the silicone material that forms cover 230. Preferably, the index of refraction of the cover layer is lower than the index of refraction of frame 220. As seen in FIG. 2A, cover 230 completely surrounds LED 210, extending up to frame 220; the cover extends to the frame in the case of a continuous frame. In the case of an open frame, the cover 230 will extend to a substrate region in the portion in which the frame is open. In an exemplary embodiment, the boundary edge of the cover is coupled to an outer edge of the frame.

Cover 230 also includes a wavelength converting material, or a combination of wavelength converting materials. In an exemplary embodiment, the wavelength converting material is selected to be the same wavelength converting material of frame 220. However, because the emitted light intensity is greater in the region of cover 230, the concentration of the wavelength converting material is also greater than that of the frame 220. In an alternative embodiment, the wavelength converting material of cover 230 can convert to a different wavelength than the wavelength converting material of frame 220 using a different wavelength converting material or combination of wavelength converting materials or using a combination of the same wavelength converting material as used in the frame along with another wavelength converting material. Variations in the stimulated emission intensity of a wavelength converting material, when combined with the blue light of the LED can result in an overall perceived color uniformity of the light emitted from the package. As with the frame 220, the wavelength converting material may be mixed in with the material of the cover 230.

Figure 2B:
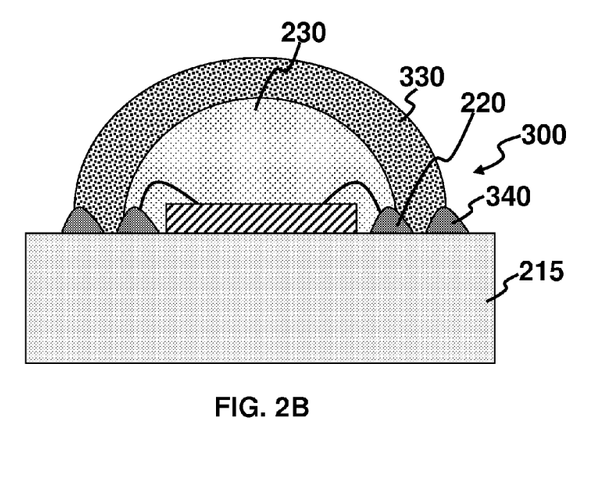

FIG. 2B schematically depicts a packaged LED 300 according to a further embodiment of the present invention. The package includes a first frame 220 and first cover 230 that are substantially similar to those described in connection with FIG. 2A. A further cover layer 330 and further frame 340 are formed over cover 230 and outside frame 220. Cover 330 can include a light scattering material to further enhance light uniformity. The further frame 340 optionally includes wavelength converting materials that are the same or different from the first frame 220, first cover layer 230 as in the manner discussed above. That is, the wavelength converting materials in frame 220, cover 230, and frame 340 are independently selected—they may be the same or different, the same with different concentrations, a mixture that includes one or more of the same materials, or all can be different from one another.

Figure 2C:
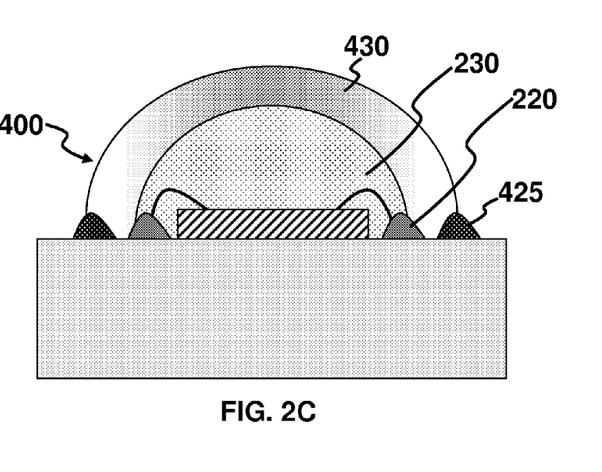

FIG. 2C depicts a further embodiment of the present invention. As with the previous embodiments, a frame 220 and cover 230 are formed as set forth in connection with FIG. 2A. Additionally, a second frame 425 and a second cover 430 are formed outside frame 220 and above cover 230, respectively. Second cover 430 and second frame 425 include wavelength converting materials of a different wavelength than those in frame 220 and cover 230. However, as with cover 230, cover 430 includes a higher concentration of wavelength converting material than frame 425 since the distribution of emitted light remains the same through the second cover 430 and frame 425. The addition of a second layer with a different wavelength converting material increases the possible range of light colors emitted from the overall package. As with the embodiment of FIG. 2B, the wavelength converting materials of the frame 425 and cover 430 can be different than those of frame 220 and cover 230 and can be different from each other and can be combinations of wavelength converting materials, as described above.

While the foregoing invention has been described in terms of the above exemplary embodiments, it is understood that various modifications and variations are possible. Accordingly, such modifications and variations are within the scope of the invention as set forth in the following claims.

What is claimed is:

1. A packaged light emitting diode comprising:
one or more light emitting diodes mounted on a substrate;
a frame disposed on at least a portion of the substrate and substantially surrounding the one or more light emitting diodes without contacting the one or more light emitting diodes, the frame being substantially transparent to light emitted from the one or more light emitting diodes and including one or more first wavelength converting materials for converting at least a portion of the light emitted from the one or more light emitting diodes having an emission wavelength to a first wavelength different from the emission wavelength, wherein the frame has a height determined according to a beam angle of the light emitted from the one or more light emitting diodes, a height and a width of the one or more light emitting diodes, and a distance between an edge of the one or more light emitting diodes and a center line of the frame;
a cover covering the one or more light emitting diodes and coupled to the frame, the cover being substantially transparent to light emitted from the one or more light emitting diodes and including one or more second wavelength converting materials for converting at least a portion of the light emitted from the one or more light emitting diodes at the emission wavelength to a second wavelength different from the emission wavelength, the one or more wavelength converting materials and the one or more second wavelength converting materials differing in a wavelength converting material concentration or in a converted light wavelength or in a combination of wavelength converting materials.

2. The packaged light emitting diode according to claim 1 wherein the one or more light emitting diodes are semiconductor materials.

3. The packaged light emitting diode according to claim 1 wherein the one or more light emitting diodes emit at least one primary color wavelength.

4. The packaged light emitting diode according to claim 1 wherein the one or more light emitting diodes comprise an organic light emitting diode (OLED).

5. The packaged light emitting diode according to claim 1 wherein the one or more first and the one or more second wavelength converting materials are fluorescence materials.

6. The packaged light emitting diode according to claim 5 wherein the concentration of the fluorescence material in the cover is different from the concentration of the fluorescence material in the frame.

7. The packaged light emitting diode according to claim 5 wherein fluorescence material is positioned within the cover and within the frame.

8. The packaged light emitting diode according to claim 1 wherein the one or more light emitting diodes emit a first light, and the one or more first and the one or more second wavelength converting materials are fluorescence materials which emit a second and a third light, respectively, following stimulated emission from the first light emitted by the one or more light emitting diodes.

9. The packaged light emitting diode according to claim 1 wherein the cover is substantially hemispherically shaped.

10. The packaged light emitting diode according to claim 1 further comprising a second frame formed outside the first frame and a second cover formed over the first cover.

11. The packaged light emitting diode according to claim 1 wherein the frame has a refractive index greater than a refractive index of the cover with respect to a primary color wavelength of the one or more light emitting diodes.

12. The packaged light emitting diode according to claim 1 wherein the frame is selected from a closed frame or an open frame.

13. The packaged light emitting diode according to claim 1 wherein the frame and the cover are selected from organic or inorganic materials.

14. The packaged light emitting diode according to claim 10 wherein the second cover includes a light scattering material.

15. A packaged light emitting diode comprising:
one or more light emitting diodes mounted on a substrate;
a silicone frame disposed on at least a portion of the substrate and substantially surrounding the one or more light emitting diodes without contacting the one or more light emitting diodes, the frame being substantially transparent to light emitted from the one or more light emitting diodes and including one or more first wavelength converting phosphors for converting at least a portion of the light emitted from the one or more light emitting diodes having an emission wavelength to a first wavelength different from the emission wavelength, wherein the silicone frame has a height determined according to a beam angle of the light emitted from the one or more light emitting diodes, a height and a width of the one or more light emitting diodes, and a distance between an edge of the one or more light emitting diodes and a center line of the frame;

a silicone cover covering the one or more light emitting diode coupled to the silicone frame at an outer edge thereof, the silicone cover being substantially transparent to light emitted from the one or more light emitting diodes and including one or more second wavelength converting phosphors, the one or more first wavelength converting phosphors and the one or more second light converting phosphors differing in a phosphor concentration or in a composition or in a combination of phosphors.

16. The packaged light emitting diode according to claim 15 wherein the one or more light emitting diodes are semiconductor materials.

17. The packaged light emitting diode according to claim 5 wherein the one or more light emitting diodes emit at least one primary color wavelength.

18. The packaged light emitting diode according to claim 15 wherein the one or more light emitting diode comprise an organic light emitting diode (OLED).

19. The packaged light emitting diode according to claim 15 wherein the one or more light emitting diodes emit a first light and the one or more first and the one or more second wavelength converting phosphors emit a second and a third light, respectively, through stimulated emission from the first light.

20. The packaged light emitting diode according to claim 15 wherein the silicone cover is substantially hemispherically shaped.

21. The packaged light emitting diode according to claim 15 further comprising a second silicone frame formed outside the first silicone frame and a second silicone cover formed over the first silicone cover.

22. The packaged light emitting diode according to claim 15 wherein the silicone frame has a refractive index greater than a refractive index of the silicone cover with respect to a primary color wavelength of the one or more light emitting diodes.

23. The packaged light emitting diode according to claim 15 wherein the silicone frame is selected from a closed frame or an open frame.

24. The packaged light emitting diode according to claim 1, wherein the frame has a thickness greater than 30% of the width of the one or more light emitting diodes.

25. The packaged light emitting diode according to claim 1, wherein the height of the frame is equal to or less than $[(x/2)+y] \tan(90°-\Theta_B/2)+a$, where:

$\Theta_B$ is the beam angle of light emitted from the one or more light emitting diodes;

a is the height of the one or more light emitting diodes;

y is the distance between the edge of the one or more light emitting diodes and the center line of the frame; and x is the width of the one or more light emitting diodes.

* * * * *